(12) United States Patent
Yu

(10) Patent No.: US 6,291,302 B1
(45) Date of Patent: Sep. 18, 2001

(54) SELECTIVE LASER ANNEAL PROCESS USING HIGHLY REFLECTIVE ALUMINUM MASK

(75) Inventor: Bin Yu, Sunnyvale, CA (US)

(73) Assignee: Advanced Micro Devices, Inc., Sunnyvale, CA (US)

(*) Notice: Subject to any disclaimer, the term of this patent is extended or adjusted under 35 U.S.C. 154(b) by 0 days.

(21) Appl. No.: 09/483,528

(22) Filed: Jan. 14, 2000

(51) Int. Cl.[7] .................. H01L 21/336; H01L 21/38
(52) U.S. Cl. .................. 438/305; 438/308; 438/546; 438/549
(58) Field of Search .................. 438/305, 308, 438/529, 306, 307, 546, 549; 257/298, 288

(56) References Cited

U.S. PATENT DOCUMENTS

| | | | |
|---|---|---|---|
| 4,595,601 | * 6/1986 | Horioka et al. | 156/635 |
| 5,308,998 | * 5/1994 | Yamazaki et al. | 257/57 |
| 5,940,699 | * 8/1999 | Sumi et al. | 438/233 |
| 5,946,581 | * 8/1999 | Gardner et al. | 438/307 |
| 5,972,764 | * 10/1999 | Huang et al. | 438/305 |
| 5,989,983 | * 11/1999 | Goo et al. | 438/473 |
| 5,998,272 | * 12/1999 | Ishida et al. | 438/305 |
| 6,080,526 | * 6/2000 | Yang et al. | 430/296 |
| 6,087,234 | * 7/2000 | Wu | 438/299 |
| 6,096,616 | * 8/2000 | Nistler et al. | 438/305 |

\* cited by examiner

*Primary Examiner*—Michael Lebentritt
(74) *Attorney, Agent, or Firm*—Foley & Lardner

(57) ABSTRACT

A method of providing a field effect transistor includes depositing a layer of a laser-reflective material on a substrate which has an active region and an inactive region; selectively removing portions of the deposited layer disposed over the active region; exposing laser energy to activate dopants in the active region; and stripping the deposited layer.

20 Claims, 4 Drawing Sheets

US 6,291,302 B1

SELECTIVE LASER ANNEAL PROCESS USING HIGHLY REFLECTIVE ALUMINUM MASK

FIELD OF THE INVENTION

The present invention relates generally to the field of integrated circuits and to methods of manufacturing integrated circuits. More particularly, the present invention relates to a method of selective laser annealing using highly reflective masks.

BACKGROUND OF THE INVENTION

Integrated circuits (ICs), such as, ultra-large scale integrated (ULSI) circuits, can include as many as one million transistors or more. The ULSI circuit can include complementary metal oxide semiconductor (CMOS) field effect transistors (FETs). The transistors can include semiconductor gates disposed between drain and source regions. The drain and source regions are typically heavily doped with a P-type dopant (boron) or an N-type dopant (phosphorous).

The drain and source regions generally include a thin extension that is disposed partially underneath the gate to enhance the transistor performance. Shallow source and drain extensions help to achieve immunity to short-channel effects which degrade transistor performance for both N-channel and P-channel transistors. Short-channel effects can cause threshold voltage roll-off and drain-induced barrier-lowering. Thus, controlling short channel effects is important to assuring proper semiconductor operation.

Conventional techniques utilize a double implant process to form shallow source and drain extensions. According to the conventional process, the source and drain extensions are formed by providing a transistor gate structure without sidewall spacers on a top surface of a silicon substrate. The silicon substrate is doped on both sides of the gate structure via a conventional doping process, such as, a diffusion process or ion implantation process. Without the sidewall spacers, the doping process introduces dopants into a thin region (i.e., just below the top surface of the substrate) to form the drain and source extensions as well as to partially form the drain and source regions.

After the drain and source extensions are formed, silicon dioxide spacers, which abut lateral sides of the gate structure, are provided over the source and drain extensions. The substrate is doped a second time to form the deeper source and drain regions. The source and drain extensions are not further doped due to the blocking capability of the silicon dioxide spacers.

As transistors disposed on integrated circuits (ICs) become smaller, transistors with shallow and ultra-shallow source/drain extensions have become more difficult to manufacture. Manufacturing is more difficult because the vertical dimensions associated with the depths of source/drain junctions and the thin extensions to the source/drain junctions must be decreased in a ratio corresponding to the reduction in lateral dimension of the manufactured MOSFET. For example, smaller transistors should have ultra-shallow source and drain extensions (less than 30 or 40 nanometer (nm) junction depth). Forming source and drain extensions with junction depths of less than 30 nm is very difficult using conventional fabrication techniques. Conventional ion implantation, diffusion doping and activation techniques make transistors on the IC susceptible to a dopant profile tail distribution that extends deep into the substrate. Also, conventional ion implantation techniques have difficulty maintaining shallow source and drain extensions because point defects generated in the bulk semiconductor substrate during ion implantation can cause the dopant to more easily diffuse (transient enhanced diffusion, TED). The diffusion often extends the source and drain extension vertically into the bulk semiconductor substrate.

As MOSFET scaling continues to be reduced, ultra-shallow and highly-activated junctions are essential for device performance. Source/Drain (S/D) extensions shallower than 30 nm are needed for sub-70 nm CMOS transistors. In addition, the transition from the S/D extensions to the channel region (laterally) must be as precipitous as possible. An aggressive scaling of the lateral abruptness of S/D extensions is critical for controlling short-channel effects in a sub-100 nm CMOS transistor. On the other hand, external resistances (S/D extension, contact, etc.) play a significant role in the device performance.

Along with the aggressive scaling of S/D extension junction depth and abruptness, it may be desirable to form a more highly doped S/D extension, as devices become smaller. For example, a Super-Doped Extension (SDE), instead of the extension associated with conventional design of LDD (lightly doped drain) or HDD (highly doped drain), are desired as transistors become smaller. Dopant electrical activation in the SDE becomes a great challenge.

Another result of the minimization of transistor critical dimensions is that the total thermal budget (Dt) of the drain and source regions and the semiconductor gate becomes more critical. In general, the thermal budget for dopant activation in the source/drain junction (including source/drain extension) should be as low as possible to provide good formation of an ultra-shallow junction. Fundamentally, reducing the thermal budget has several advantages including: (1) more accurate formation of ultra-shallow junctions; (2) formation of ultra-tight dope profiles, such as, profiles for halo implants or retrograded channel implants; and (3) reduction of dopant penetration through the gate oxide and into the gate (e.g., Boron (B) in P-channel MOSFETs). Both shallow source and drain extensions and tight profile pocket regions help to improve the immunity of a transistor to short-channel effects.

Taking advantage of the results attainable via a lower thermal budget, conventional processes have reduced thermal budgets for CMOS transistor fabrication by utilizing a rapid thermal annealing (RTA) to heat the substrate. RTA does not require a significant period of time to heat the substrate. Another approach involves a spike RTA which increases the ramping rate of RTA. Nonetheless, the substrate must be exposed to the RTA for a time period of one second or more to appropriately diffuse and activate dopants.

Conventional rapid thermal anneal processes, such as RTA, face the problems of undesired thermal diffusion and low electrical activation limited by solid solubility. One possible solution is to use a laser thermal process (LTP). LTP includes advantages such as: 1) "zero" thermal budget (a laser pulse is a few nanoseconds, approximately 8 orders of magnitude shorter than rapid thermal processes and the thermal diffusion is almost negligible); 2) metastable process above dopant solid solubility limit, allowing active dopant concentrations larger than $10^{21} cm^-$ to be achieved; and 3) selective local heating of specific regions of silicon does not add thermal budget to Vth/channel/halo implant profiles.

One of the major integration issues of LTP is that the poly-Si line above the field oxide (e.g., shallow trench isolation region) could over-melt due to poor thermal dissipation through the thick oxide. This over-melting can cause the polysilicon line to be deformed or disconnected.

Thus, there is a need for a process which overcomes these problems, such as, over-melting due to poor thermal dissipation through thick oxide. Further, there is a need for a transistor fabrication method which avoids problems of thermal diffusion and low electrical activation occurring in conventional rapid thermal processes. Even further still, there is a need for a transistor which is manufactured by a selective laser anneal process which uses a highly reflective mask.

SUMMARY OF THE INVENTION

One embodiment of the invention relates to a method of providing a field effect transistor. The method includes depositing a layer of a material on a substrate which has an active region and an inactive region; selectively removing portions of the deposited layer disposed over the active region; exposing laser energy to activate dopants in the active region; and stripping the deposited layer.

Briefly, another exemplary embodiment is related to an integrated circuit being manufactured by a process which includes depositing a mask layer over a portion of an integrated circuit; removing sections of the mask layer disposed over active areas in the portion of the integrated circuit; introducing the portion of the integrated circuit to laser energy; and removing remaining sections of the mask layer. The laser energy is reflected by remaining sections of the mask layer and the laser energy anneals active areas not covered by the mask layer.

Briefly, another exemplary embodiment is related to a method of manufacturing an integrated circuit which includes forming a portion of an integrated circuit including an active region and an inactive region on a semiconductor substrate; depositing a masking layer over the portion of the integrated circuit; selectively removing sections of the masking layer over the active region; exposing the active region to laser energy; and removing the remainder of the masking layer. The active region includes a gate stack, a source region, a drain region, a source extension, and a drain extension. The inactive region includes a field oxide. The laser energy melts a junction of the source region and source extension and a junction of the drain region and drain extension.

Other principle features and advantages of the present invention will become apparent to those skilled in the art upon review of the following drawings, the detailed description, and the appended claims.

BRIEF DESCRIPTION OF THE DRAWINGS

The exemplary embodiments will hereafter be described with reference to the accompanying drawings, wherein like numerals denote like elements, and.

DETAILED DESCRIPTION OF THE PREFERRED EMBODIMENTS

Figure 1:
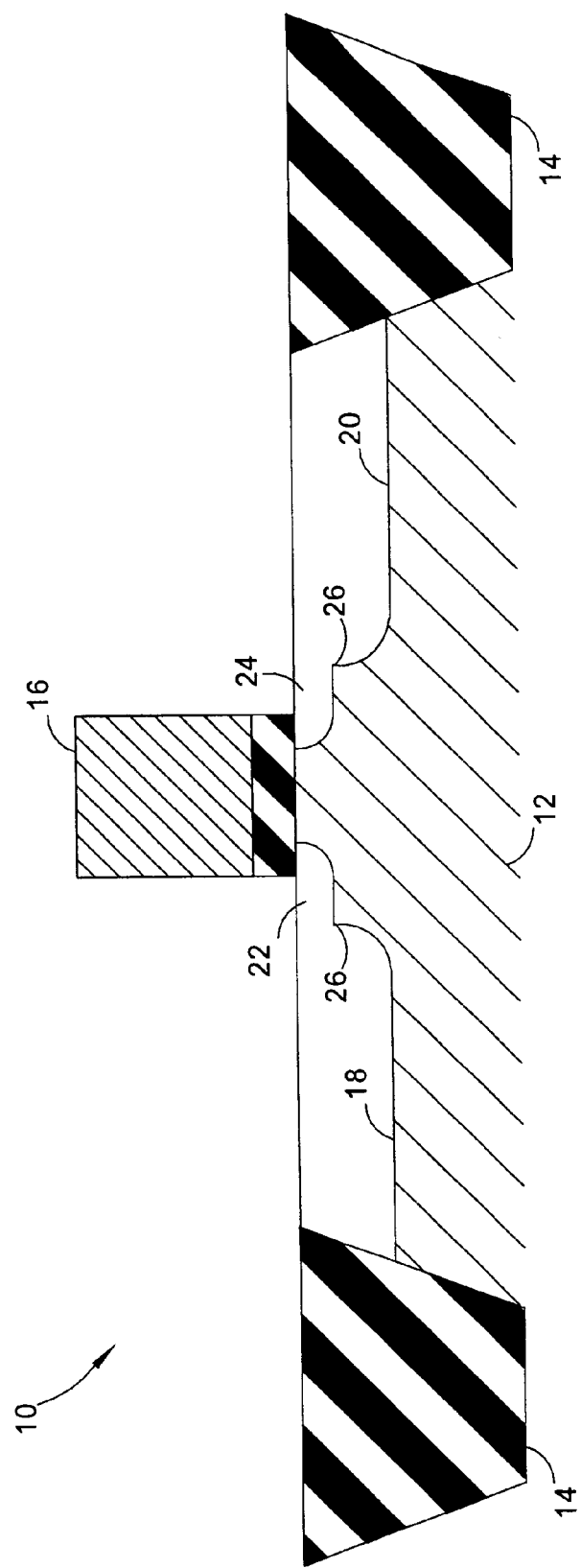
FIG. 1 is a cross-sectional view of a portion of an integrated circuit fabricated in accordance with an exemplary embodiment of the present invention.

Referring to FIG. 1, a portion 10 of an integrated circuit (IC) or chip includes a substrate 12, isolation structures 14, a gate stack 16, a source region 18, a drain region 20, a source extension 22, a drain extension 24, and source/drain (S/D) junctions 26. Portion 10 is preferably part of an ultra-large-scale integrated (ULSI) circuit having millions or more transistors. Portion 10 is manufactured as part of the IC on a semiconductor wafer, such as, a silicon wafer.

Substrate 12 is any of a variety of semiconductor materials, such as, silicon. Substrate 12 is preferably a P-type substrate. Isolation structures 14 are two field oxide or shallow trench isolation (STI) structures which provide electrical insulation for the elements there between. Gate stack 16 is any of a variety of conductive materials. In the exemplary embodiment, gate stack 16 is polysilicon disposed over a gate dielectric, such as thermally grown silicon dioxide. Gate stack 16 is aligned between active regions in substrate 12. Active regions are areas in portion 10 between the isolation structures 14 including impurities or dopants such as a p-type dopant (e.g., boron) or an n-type dopant (e.g., phosphorous).

Source region 18 and drain region 20 are formed by ion implantation. Gate stack 16 is also doped during the same implantation. The dopant is later activated by thermal activation (e.g., furnace anneal). Source region 18 and drain region 20 are formed such that they have no overlap with gate stack 16. Advantageously, this arrangement reduces or prevents gate-to-drain or gate-to-source tunneling leakage.

Source extension 22 is a shallower extension of source region 18. Drain extension 24 is a shallower extension of drain region 20. Preferably, source extension 22 and drain extension 24 extend at least partially below gate stack 16. Preferably, these extensions are 20–40 nm deep. Preferably, the source /drain regions 18 and 20 are 60–100 nm deep. Preferably, the concentration of dopants in the extensions is $5\times10^{20}$–$5\times10^{21}$cm$^{-3}$. Preferably, the width of each extension region is 30–50 nm.

Figure 2:
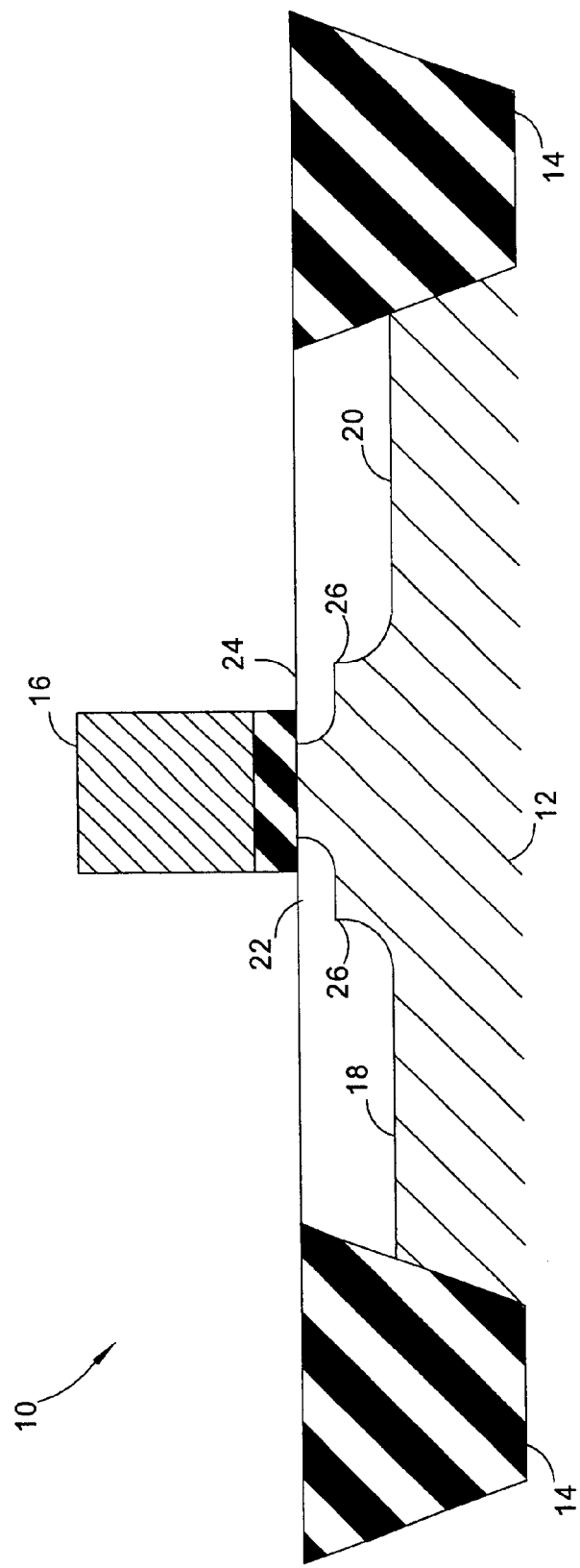
FIG. 2 is a cross-sectional view of a portion of the integrated circuit illustrated in FIG. 1, showing shallow trench isolation, gate stack, S/D extension and deep S/D contact junction formation steps.

The method of forming portion 10 is described below with reference to FIGS. 1–5. The method advantageously forms portion 10 including isolation structures 14 which are not over heated during the laser anneal. In FIG. 2, a cross-sectional view of portion 10 illustrates portion 10 after a conventional CMOS fabrication process is followed to form isolation structures 14, gate stack 16, source region 18, drain region 20, source extension 22, and drain extension 24. Regions 18, 20, 22, and 24 are not yet annealed and dopants within region 18, 20, 22, and 24 are not yet activated. For example, gate stack 16 can be formed in a CVD and selective etch process, and regions 18, 20, 22, and 24 can be initially formed in a double implant process using sidewall spacers. Regions 18, 20, 22, and 24 can also be formed by doping amorphous regions as described in U.S. patent application Ser. No. 09/187,630, filed on Nov. 6, 1998 incorporated herein by reference. Preferably, regions 18, 20, 22, and 24 are doped in a low KeV implantation process.

Figure 3:
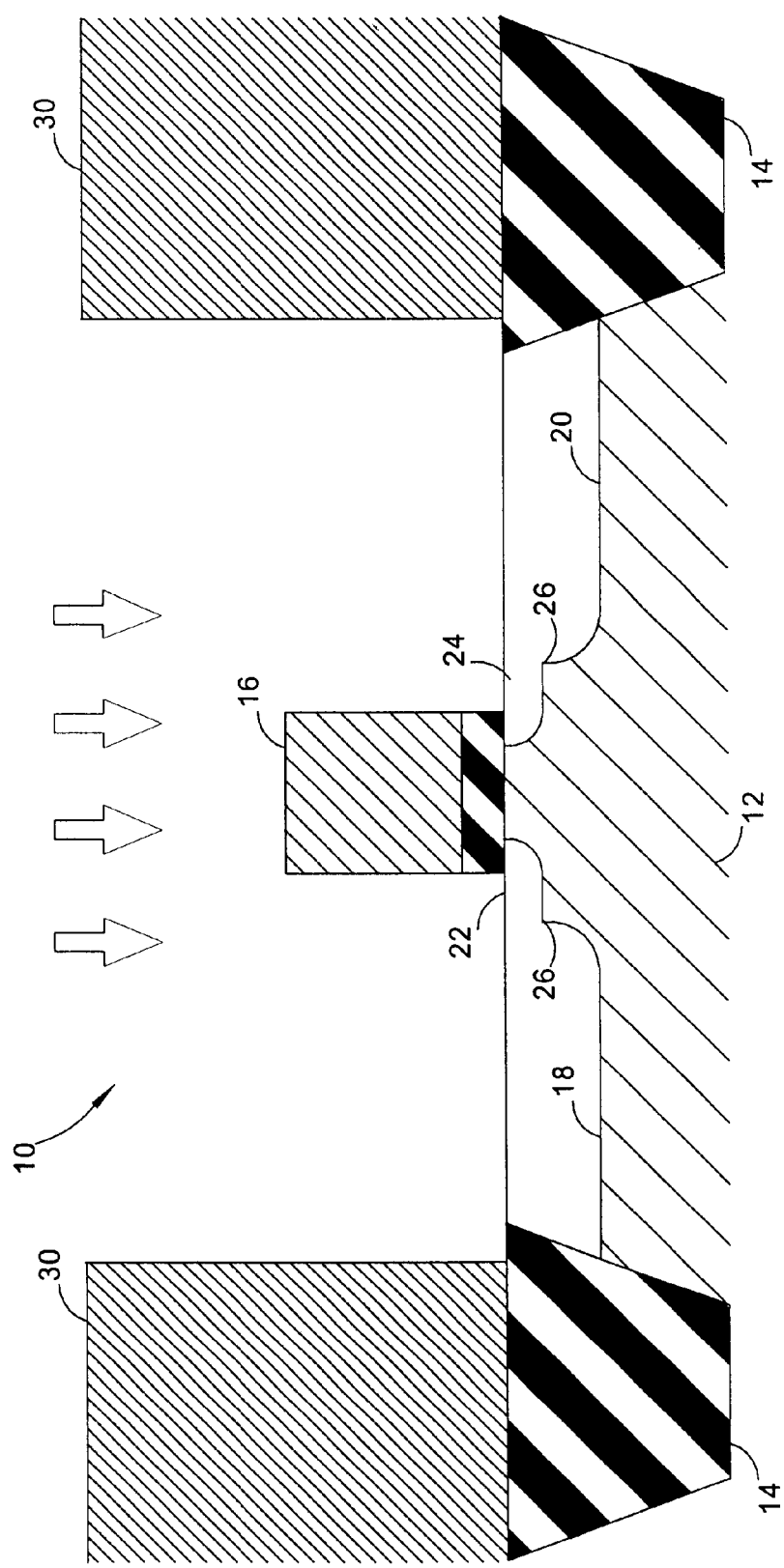
FIG. 3 is a cross-sectional view of a portion of the integrated circuit illustrated in FIG. 1, showing a deposited aluminum layer and a laser exposure step.

In FIG. 3, portion 10 includes a mask layer 30 which is deposited and selectively etched to cover inactive regions, such as isolation structures 14, and expose active regions, such as gate stack 16, source region 18, and drain region 20. Mask layer 30 is any material which has a high reflectivity to laser energy. Preferably mask layer 30 is an aluminum layer and has a thickness of 2,000–5,000 Å. Preferably, mask layer 30 is patterned by photo-lithography.

Figure 4:
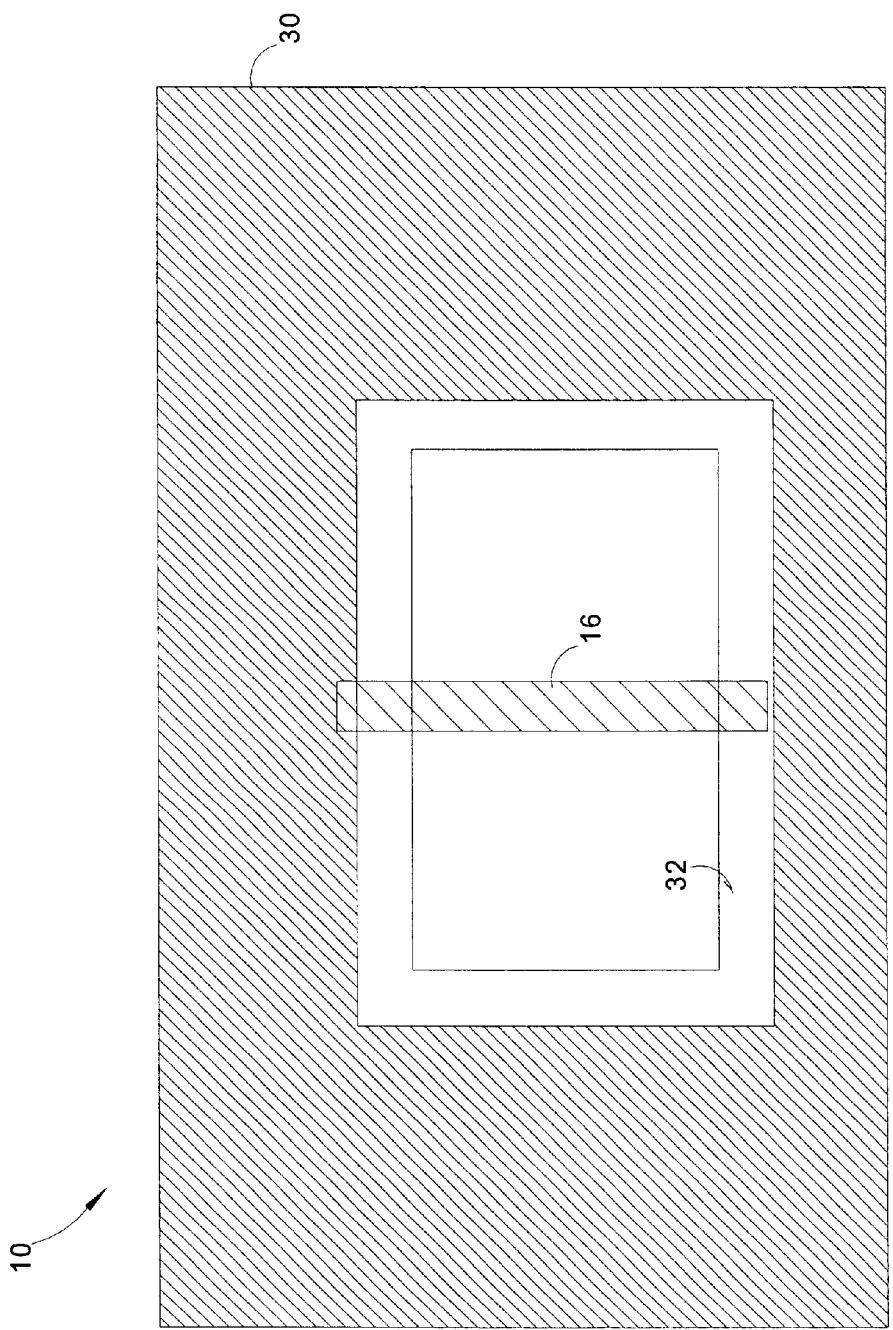
FIG. 4 is a top view of a portion of the integrated circuit illustrated in FIG. 3.

As shown in FIG. 4, mask layer 30 is deposited and etched to have a margin or edge 32. Margin 32 is present because mask layer 30 cannot be perfectly deposited and etched to cover only the inactive region. Margin 32 exposes a very small portion of the inactive region, insuring that all of the active region will be exposed after the deposition and etching of mask layer 30. Margin 32 is preferably 20–30 nm wide. After the laser annealing, mask layer 30 is stripped or removed by a suitable process, such as wet chemistry, and the conventional CMOS fabrication process is continued.

Laser annealing is a thermal process which advantageously uses a laser pulse of only a few nanoseconds, which is approximately 8 orders of magnitude shorter than rapid thermal processes. Further, the thermal diffusion with laser annealing is almost negligible. Moreover, laser annealing is a metastable process above the dopant solid solubility limit, allowing active dopant concentrations larger than $10^{21} cm^{-3}$ to be achieved. Even further, laser annealing provides selective local heating of specific regions of silicon which does not add a thermal budget to Vth, channel, or halo implant profiles. Laser annealing provides full (100%) dopant activation. In an exemplary embodiment, the laser reflective material of mask layer 30 reflects 80% of laser energy. In another embodiment, the laser reflective material of mask layer 30 reflects 90% laser energy. The amount of laser energy sufficient to reflect laser energy prevents overheating of the field oxide and damage to polysilicon lines adjacent to field oxide.

Advantageously, mask layer 30 covers the area on portion 10 where no laser anneal is needed to highly activate the dopant (i.e., in the inactive areas). Mask layer 30 is removed in the locations needing exposure to the laser anneal. Specifically, S/D junctions 26 are in the open area in order to receive the needed laser annealing. Because of the high reflectivity of mask layer 30, the majority of the laser light is reflected from mask layer 30. Such selective use of mask layer 30 during the laser anneal process prevents the overheating of oxides (e.g., isolation structures 14) which prevents polysilicon lines such as conductor 16 from being destroyed when it crosses over an isolation structure.

While the embodiments illustrated in the FIGURES and described above are presently preferred, it should be understood that these embodiments are offered by way of example only. Other embodiments may include, for example, different techniques for selectively providing mask layer 30. The invention is not limited to a particular embodiment, but extends to various modifications, combinations, and permutations that nevertheless fall within the scope and spirit of the appended claims.

What is claimed is:

1. A method of providing a field effect transistor comprising:
   depositing a layer of a material on a substrate, the substrate having an active region and an inactive region;
   selectively removing portions of the deposited layer disposed over the active region and leaving portions of the deposited layer disposed over the inactive region;
   exposing laser energy to activate dopants in the active region; and
   stripping the deposited layer.

2. The method of claim 1, wherein the step of selectively removing portions of the deposited layer comprises:
   patterning the deposited layer; and
   etching the deposited layer in active areas.

3. The method of claim 1, wherein the step of exposing laser energy to activate dopants in the active region comprises melting a source drain junction.

4. The method of claim 1, wherein the step of selectively removing portions of the deposited layer comprises a chemical etching process selective to the active areas.

5. The method of claim 1, wherein the step of depositing a layer of a material on a substrate comprises depositing a laser reflective material.

6. The method of claim 1, wherein the step of depositing a layer of a material on a substrate comprises depositing an aluminum layer having a thickness of approximately 2,000–5,000 Å.

7. The method of claim 1, wherein the step of selectively removing portions of the deposited layer disposed over the active region comprises providing a margin wherein portions of the inactive region are removed to insure that all the deposited layer is uncovered in the active region.

8. An integrated circuit being manufactured by a process comprising:
   (a) depositing a mask layer over a portion of an integrated circuit;
   (b) removing sections of the mask layer disposed over active areas in the portion of the integrated circuit and leaving sections of the mask layer disposed over inactive areas in the portion of the integrated circuit;
   (c) introducing the portion of the integrated circuit to laser energy, the laser energy being reflected by remaining sections of the mask layer and the laser energy annealing active areas not covered by the mask layer; and
   (d) removing remaining sections of the mask layer.

9. The integrated circuit manufactured by the process of claim 8, wherein depositing a mask layer over a portion of an integrated circuit comprises depositing an aluminum layer having a thickness of approximately 2,000–5,000 Å.

10. The integrated circuit manufactured by the process of claim 8, wherein depositing a mask layer over a portion of an integrated circuit comprises depositing a material which has a high reflectivity for laser light.

11. The integrated circuit manufactured by the process of claim 8, further comprising forming shallow trench isolation (STI) structures in the portion of the integrated circuit.

12. The integrated circuit manufactured by the process of claim 8, further comprising
   (e) removing, simultaneously with step (b), a section of the mask layer disposed over inactive areas proximate active areas to insure that all active areas are uncovered by the mask layer.

13. A method of manufacturing an integrated circuit comprising:
   forming a portion of an integrated circuit including an active region and an inactive region on a semiconductor substrate, the active region comprising a gate stack, a source region, a drain region, a source extension, and a drain extension, the inactive region comprising a field oxide;
   depositing a masking layer over the portion of the integrated circuit;
   selectively removing sections of the masking layer over the active region and leaving sections of the masking layer over the inactive region;
   exposing the active region to laser energy, the laser energy melting a junction of the source region and source extension and a junction of the drain region and drain extension; and
   removing the remainder of the masking layer.

14. The method of claim 13, wherein the step of exposing the active region to laser energy does not over heat the field oxide in the inactive region.

15. The method of claim 13, wherein the step of exposing the active regions to comprises melting a junction between the source region and the source extension and a junction between the drain region and the drain extension.

16. The method of claim 13, wherein the step of selectively removing sections of the masking layer over the active region comprises wet etching.

17. The method of claim 13, wherein the gate stack comprises a polysilicon structure and an oxide layer.

18. The method of claim 13, wherein the inactive region comprises a shallow trench isolation (STI) structure.

19. The method of claim 13, further comprising removing a section of the mask layer disposed over inactive areas proximate the active region to insure that the entire active region is uncovered by the mask layer.

20. The method of claim 13, wherein the step of depositing a masking layer over the portion of the integrated circuit comprises depositing a laser reflective material which reflects laser energy a sufficient amount so as to prevent overheating of the field oxide and damage to polysilicon lines adjacent to field oxide.

* * * * *